United States Patent
Tomida et al.

(10) Patent No.: US 10,074,328 B2
(45) Date of Patent: Sep. 11, 2018

(54) ACTIVE MATRIX SUBSTRATE

(71) Applicant: SHARP KABUSHIKI KAISHA, Osaka (JP)

(72) Inventors: Masahiro Tomida, Osaka (JP); Naoki Ueda, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/482,959

(22) Filed: Apr. 10, 2017

(65) Prior Publication Data

US 2017/0213511 A1 Jul. 27, 2017

Related U.S. Application Data

(63) Continuation of application No. 15/117,507, filed as application No. PCT/JP2015/053588 on Feb. 10, 2015, now Pat. No. 9,741,308.

(30) Foreign Application Priority Data

Feb. 14, 2014 (JP) .................................. 2014-026292

(51) Int. Cl.
*H01L 29/786* (2006.01)
*G02F 1/1368* (2006.01)
(Continued)

(52) U.S. Cl.
CPC ......... *G09G 3/3648* (2013.01); *G02F 1/1368* (2013.01); *G02F 1/13306* (2013.01);
(Continued)

(58) Field of Classification Search
CPC .. H01L 29/786–29/78696; H01L 29/24; H01L 27/124; H01L 27/1214–27/1296;
(Continued)

(56) References Cited

U.S. PATENT DOCUMENTS 5,528,055 A * 6/1996 Komori ............. H01L 29/41733
257/66
5,589,406 A * 12/1996 Kato .................... G02F 1/13454
438/164

(Continued)

FOREIGN PATENT DOCUMENTS

JP 10-125933 A 5/1998
JP 2001-313398 A 11/2001
(Continued)

OTHER PUBLICATIONS

Non-final Office Action of U.S. Appl. No. 15/117,507.
Official Communication issued in International Patent Application No. PCT/JP2015/053588, dated Mar. 31, 2015.

*Primary Examiner* — Eric Ward
(74) *Attorney, Agent, or Firm* — ScienBiziP, P.C.

(57) ABSTRACT

An active matrix substrate includes a display region in which a plurality of pixels are provided and a frame region lying outside the display region. The frame region includes a plurality of peripheral circuit TFTs which are supported by a substrate and which are constituents of a driving circuit. Each of the plurality of peripheral circuit TFTs includes a gate electrode, an oxide semiconductor layer arranged so as to at least partially extend over the gate electrode but to be insulated from the gate electrode, and source and drain electrodes connected with the oxide semiconductor layer.

11 Claims, 9 Drawing Sheets

(51) Int. Cl.

| | |
|---|---|
| *G09G 3/36* | (2006.01) |
| *H01L 27/12* | (2006.01) |
| *H01L 29/417* | (2006.01) |
| *G02F 1/1362* | (2006.01) |
| *G02F 1/133* | (2006.01) |
| *G02F 1/1343* | (2006.01) |
| *H01L 29/24* | (2006.01) |
| *H01L 29/423* | (2006.01) |
| *H01L 27/32* | (2006.01) |
| *G02F 1/1345* | (2006.01) |
| *G02F 1/1333* | (2006.01) |

(52) U.S. Cl.
CPC .. *G02F 1/134309* (2013.01); *G02F 1/136286* (2013.01); *H01L 27/124* (2013.01); *H01L 27/1225* (2013.01); *H01L 27/3276* (2013.01); *H01L 29/24* (2013.01); *H01L 29/41733* (2013.01); *H01L 29/42356* (2013.01); *H01L 29/7869* (2013.01); *H01L 29/78606* (2013.01); *H05K 999/99* (2013.01); *G02F 1/13454* (2013.01); *G02F 1/133345* (2013.01); *G02F 2001/133302* (2013.01); *G02F 2201/123* (2013.01); *G02F 2202/10* (2013.01); *G09G 2310/0291* (2013.01); *G09G 2310/08* (2013.01); *G09G 2320/0214* (2013.01); *G09G 2330/021* (2013.01); *H01L 29/78696* (2013.01)

(58) Field of Classification Search
CPC .... G02F 1/133–1/1368; G02F 1/13454; G02F 2201/123; G02F 2201/133302; G02G 3/3648–3/3666; G01F 1/13306; G01F 1/133345; G01F 1/136286; G01F 1/1368; G09G 2310/0291; G09G 2310/08; G09G 2330/021; G09G 2330/0214; G09G 3/3648–3/3666

See application file for complete search history.

(56) References Cited

U.S. PATENT DOCUMENTS

| | | | | |
|---|---|---|---|---|
| 5,886,757 | A * | 3/1999 | Song | H01L 29/41733 |
| | | | | 257/59 |
| 6,566,695 | B2 | 5/2003 | Kumashiro | |
| 9,530,894 | B2 * | 12/2016 | Koezuka | H01L 27/124 |
| 2003/0160240 | A1 | 8/2003 | Okumura | |
| 2012/0001189 | A1 | 1/2012 | Matsubara et al. | |
| 2012/0056646 | A1 | 3/2012 | Watanabe et al. | |
| 2012/0138922 | A1 | 6/2012 | Yamazaki et al. | |
| 2012/0146969 | A1 | 6/2012 | Sakamoto et al. | |
| 2012/0199891 | A1 * | 8/2012 | Suzuki | H01L 29/78606 |
| | | | | 257/288 |
| 2013/0087781 | A1 | 4/2013 | Yeh | |
| 2013/0334530 | A1 | 12/2013 | Katoh et al. | |
| 2014/0183524 | A1 | 7/2014 | Jeoung | |
| 2014/0217398 | A1 | 8/2014 | Chang | |
| 2015/0255491 | A1 | 9/2015 | Uchida | |

FOREIGN PATENT DOCUMENTS

| | | | |
|---|---|---|---|
| JP | 2003-249655 | A | 9/2003 |
| JP | 2003-273364 | A | 9/2003 |
| JP | 2009-135272 | A | 6/2006 |
| JP | 2006-269491 | A | 10/2006 |
| JP | 2012-074681 | A | 4/2012 |
| JP | 2012-134475 | A | 7/2012 |
| WO | 2010/107027 | A1 | 9/2010 |
| WO | 2011/024499 | A1 | 3/2011 |
| WO | 2011/043300 | A1 | 4/2011 |
| WO | 2012/124511 | A1 | 9/2012 |
| WO | 2014/069260 | A1 | 5/2014 |

* cited by examiner

ACTIVE MATRIX SUBSTRATE

TECHNICAL FIELD

The present invention relates to an active matrix substrate for use in display devices and particularly to an active matrix substrate which includes an oxide semiconductor TFT.

BACKGROUND ART

An active matrix substrate for use in liquid crystal display devices, or the like, includes a switching element, such as a thin film transistor (hereinafter, "TFT"), in each pixel. Examples of such a switching element which have been conventionally used in various applications include a TFT which includes an amorphous silicon film as the active layer (hereinafter, "amorphous silicon TFT") and a TFT which includes a polycrystalline silicon film as the active layer (hereinafter, "polycrystalline silicon TFT").

In recent years, using materials other than amorphous silicon and polycrystalline silicon as the material of the active layer of TFTs has been attempted. For example, Patent Document 1 discloses a liquid crystal display device in which the active layer of TFTs is formed using an oxide semiconductor film of InGaZnO (an oxide consisting of indium, gallium and zinc), or the like. Such a TFT is referred to as "oxide semiconductor TFT".

The oxide semiconductor TFT is capable of operating at a higher speed than the amorphous silicon TFT. The oxide semiconductor film is manufactured through a simpler process than the polycrystalline silicon film and is applicable to devices which require a large area. Therefore, application of the oxide semiconductor TFT, as a high-performance active element which can be manufactured with reduced manufacturing steps and a reduced manufacturing cost, to display devices, and the like, has been encouraged.

Since the mobility of the oxide semiconductor is high, it is possible to achieve equal or higher performance even if the size is reduced as compared with conventional amorphous silicon TFTs. Therefore, when an active matrix substrate is manufactured using the oxide semiconductor TFT, the area occupancy of the TFT in each pixel can be reduced, and the pixel aperture ratio can be improved. Accordingly, bright display can be realized with a reduced amount of light from the backlight, and low power consumption can be realized.

Particularly in small-size, high-resolution display devices for use in smartphones and the like, it is difficult to increase the pixel aperture ratio due to, for example, limitations on the minimum width of wires (process rules). In view of such, if the pixel aperture ratio is improved by using the oxide semiconductor TFT, display of high-resolution images can be realized while the power consumption is reduced.

Since the off-leak characteristic of the oxide semiconductor TFT is excellent, it is possible to utilize a method where display is performed with reduced image rewriting frequency. For example, in the case of displaying a still image, it is possible to operate the TFT so as to rewrite the image data once every second. Such a driving method is referred to as "intermittent driving method" or "low frequency driving method". Using the intermittent driving method enables to greatly reduce the power consumption by the display device.

CITATION LIST

Patent Literature

Patent Document 1: Japanese Laid-Open Patent Publication No. 2012-134475

Patent Document 2: WO 2011/024499
Patent Document 3: Japanese Laid-Open Patent Publication No. 2012-74681

SUMMARY OF INVENTION

Technical Problem

In an active matrix substrate for use in a liquid crystal display device, a TFT provided in each of the pixels in the display region (hereinafter, also referred to as "pixel TFT") has a source electrode coupled with a signal line and a drain electrode coupled with a pixel electrode. When the pixel TFT is on, a pixel voltage is applied to the pixel electrode via the signal line. In a period where the pixel TFT is off, the pixel voltage is retained by, for example, liquid crystal capacitance Clc and storage capacitance Ccs.

In the pixel TFT, the potential of the drain electrode in an OFF period is not so high. Therefore, when an oxide semiconductor TFT is used, suppressing an off leakage current is relatively easy.

Meanwhile, a common active matrix substrate has a frame region outside the display region, in which connection terminals and driving circuits are to be provided. Also, the technique of monolithically (integrally) forming driving circuits, such as a gate driver and a source driver, on a substrate in the frame region has been known. These monolithic drivers include a shift resistor consisting of, for example, a plurality of TFTs (hereinafter, also referred to as "peripheral circuit TFTs"). For example, Patent Document 2 discloses a configuration of a monolithic gate driver which includes a shift resistor of multiple stages respectively coupled with gate wires.

The monolithic driver can be formed simultaneously with pixel TFTs, i.e., using the process of forming pixel TFTs. When the active layer of pixel TFTs and peripheral circuit TFTs are formed of an oxide semiconductor, each of the TFTs can have a relatively small size. Therefore, a monolithic driver including a plurality of peripheral circuit TFTs can be provided even in a narrow frame region. In such a configuration, contrary to conventional devices, it is not necessary to mount an IC chip for a driver on a substrate, and therefore, the number of parts and the number of formation steps can be reduced. Also, a driver can be arranged within a narrow region, and therefore, the area of the frame region can also be narrowed.

Note that, however, the present inventors found that, even when oxide semiconductor TFTs are used as the peripheral circuit TFTs, designing the TFTs so as to have a small size (particularly, channel length) sometimes leads to deterioration of the off-leak characteristic. In some of the peripheral circuit TFTs, the largeness of the drain potential relative to the source potential during OFF periods (source-drain voltage) is large as compared with the case of pixel TFTs. Therefore, in the peripheral circuit TFTs, there is a probability that dielectric breakdown during OFF periods, which does not matter in the pixel TFTs, occurs and the current leakage increases.

As the technique of improving the off-leak characteristic of a TFT (i.e., increasing the breakdown voltage of a TFT), for example, Patent Document 3 discloses a configuration where the gate electrode and the drain electrode are in an offset arrangement such that the area of overlap of these electrodes is reduced. However, in a TFT disclosed in Patent Document 3, although an increase of the breakdown voltage can be expected, there is a probability that a decrease of the ON current is caused because the gate electrode and the drain electrode are arranged so as to be set off from each other. Further, this leads to an increase of the area of the TFT because an auxiliary gate electrode is necessary. When such a configuration is applied to peripheral circuit TFTs, it is difficult to realize a narrow frame.

The present invention was conceived in order to solve the above-described problems. One of the objects of the present invention is to provide an active matrix substrate which includes an oxide semiconductor TFTs of excellent breakdown voltage.

Solution to Problem

An active matrix substrate of an embodiment of the present invention includes a display region in which a plurality of pixels are provided and a frame region lying outside the display region, the frame region including a plurality of peripheral circuit TFTs which are constituents of a driving circuit, wherein each of the plurality of peripheral circuit TFTs includes a gate electrode, an oxide semiconductor layer arranged so as to at least partially extend over the gate electrode but to be insulated from the gate electrode, and source and drain electrodes connected with the oxide semiconductor layer, and in at least some of the plurality of peripheral circuit TFTs, a source connecting region that is a connecting region between the oxide semiconductor layer and the source electrode and a drain connecting region that is a connecting region between the oxide semiconductor layer and the drain electrode are asymmetrically provided.

In one embodiment, a width of the drain connecting region is smaller than a width of the source connecting region.

In one embodiment, an area of the drain connecting region is smaller than an area of the source connecting region.

In one embodiment, a width of the drain electrode is smaller than a width of the source electrode.

In one embodiment, the active matrix substrate further includes an insulating layer interposed between the oxide semiconductor layer and the source and drain electrodes, the insulating layer having a source contact hole and a drain contact hole at positions corresponding to the source electrode and the drain electrode, respectively, wherein the source electrode and the drain electrode are connected with the oxide semiconductor layer inside the source contact hole and the drain contact hole, respectively, and the source contact hole and the drain contact hole have different shapes.

In one embodiment, the gate electrode is provided on the insulating layer.

In one embodiment, the gate electrode is provided under the insulating layer.

In one embodiment, the plurality of peripheral circuit TFTs include a peripheral circuit TFT in which the source connecting region and the drain connecting region are asymmetrically provided and a peripheral circuit TFT in which the source connecting region and the drain connecting region are symmetrically provided.

In one embodiment, in a peripheral circuit TFT in which the source connecting region and the drain connecting region are asymmetrically provided, a voltage applied to the drain electrode is not less than 20 V during an OFF period.

In one embodiment, the oxide semiconductor layer includes at least one element selected from the group consisting of In, Ga, and Zn.

In one embodiment, the oxide semiconductor layer includes an In—Ga—Zn—O based semiconductor, the In—Ga—Zn—O based semiconductor including a crystalline portion.

Advantageous Effects of Invention

According to an embodiment of the present invention, in an oxide TFT provided in an active matrix substrate, an increase of the breakdown voltage is realized, and the off leakage current can be suppressed.

DESCRIPTION OF EMBODIMENTS

Hereinafter, an active matrix substrate (TFT substrate) of an embodiment of the present invention is described with reference to the drawings, although the present invention is not limited to embodiments which will be described below.

The active matrix substrate of an embodiment of the present invention is suitably used in, for example, a liquid crystal display device which operates in a vertical electric field mode (e.g., VA (Vertical Alignment), a TN (Twisted Nematic)) or transverse electric field mode (e.g., IPS (In Plane Switching), or a FFS (Fringe Field Switching)) mode. Also, the active matrix substrate of an embodiment of the present invention is suitably used in other types of display devices, such as organic EL display devices. The configuration of TFTs formed in the active matrix substrate of an embodiment of the present invention is also applicable to power devices which are constructed using TFTs (e.g., power supply circuits, high voltage I/O devices).

The active matrix substrate of an embodiment of the present invention includes a display region and a frame region lying outside the display region. In the display region, a plurality of pixels are arranged in a matrix. Each of the plurality of pixels includes a pixel TFT which serves as an active element. When a monolithic driver is provided in the frame region, the frame region includes a plurality of peripheral circuit TFTs that are constituents of the monolithic driver.

Figure 1:
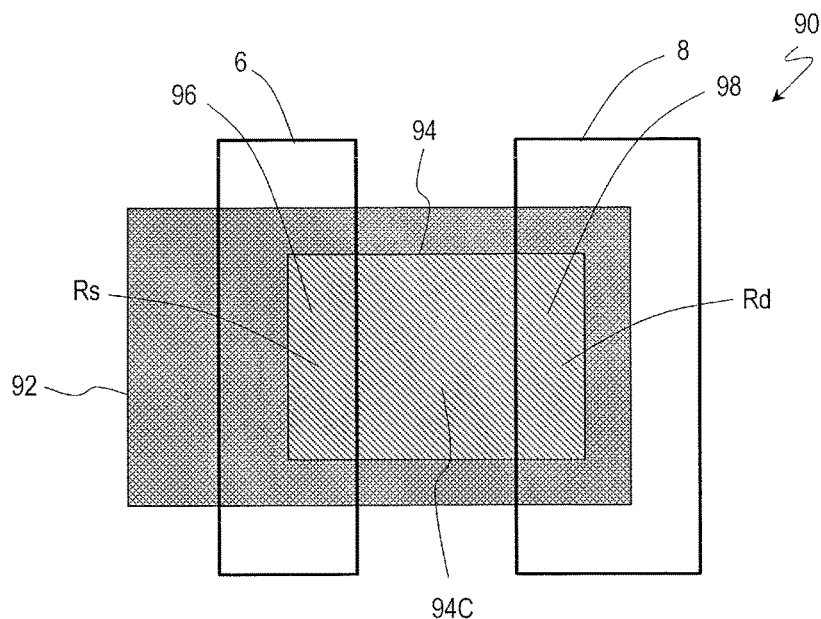
FIG. 1 A plan view showing a configuration of an oxide semiconductor TFT of a comparative example.

Now, dielectric breakdown which can occur during OFF periods in a peripheral circuit TFT is described. FIG. 1 is a plan view showing a TFT 90 (peripheral circuit TFT) of a comparative example which is provided in the frame region. The TFT 90 may be a TFT included in a shift resistor which is a constituent of the monolithic gate driver. For example, the TFT 90 may be an output buffer transistor whose drain is coupled with a gate wire.

The TFT 90 includes a gate electrode 92, a gate insulating layer (not shown) covering the gate electrode 92, and an island-shaped oxide semiconductor layer 94 which is arranged so as to extend over the gate electrode 92 with a gate insulating layer interposed therebetween. The oxide semiconductor layer 94 is coupled with a source electrode 96 and a drain electrode 98. The source electrode 96 and the drain electrode 98 are spaced away from each other such that a channel region 94C is formed between the source electrode 96 and the drain electrode 98.

As shown in FIG. 1, the source electrode 96 and the drain electrode 98 are respectively parts of a source line 6 and a drain line 8 each linearly extending across edges of the oxide semiconductor layer 94. In this configuration, a connecting region between the source line 6 and the oxide semiconductor layer 94 (hereinafter, also referred to as "source connecting region Rs") corresponds to the source electrode 96 of the TFT 90, and a connecting region between the drain line 8 and the oxide semiconductor layer 94 (hereinafter, also referred to as "drain connecting region Rd") corresponds to the drain electrode 98 of the TFT 90. The channel region 94C of the TFT 90 is provided between the source connecting region Rs and the drain connecting region Rd. The channel width of the channel region 94C is substantially equal to the width of the oxide semiconductor layer 94.

In this specification, the width of the oxide semiconductor layer and the channel width mean dimensions of the oxide semiconductor layer and the channel region in a direction perpendicular to a direction defined from the source electrode toward the drain electrode (also referred to as "channel current direction"), which is also referred to as "width direction". The channel length means a dimension of the channel region in a direction parallel to the direction defined from the source electrode toward the drain electrode. The width of the source connecting region Rs (or source electrode) and the width of the drain connecting region (or drain electrode) mean dimensions of these regions in the aforementioned width direction.

From the viewpoint of narrowing the frame region, it is preferred that a plurality of TFTs 90 are arranged as closely as possible to one another. When using a configuration where the source electrode 96 and the drain electrode 98 are respectively parts of the source line 6 and the drain line 8 as described above, the size of each TFT 90 can be reduced. Therefore, it is possible to densely arrange a large number of TFTs 90 in a relatively narrow area.

However, in the TFT 90 that has such a configuration, the overlapping area of the drain electrode 98 and the oxide semiconductor layer 94 is large. Therefore, when the potential on the drain electrode side is high, there is a probability that a current leakage flows between the source and the drain during TFT OFF periods (in a state where gate voltage Vg applied to the gate voltage 92 is less than threshold voltage Vth).

In some of the peripheral circuit TFTs included in the gate driver, the drain voltage applied during OFF periods is higher than in the pixel TFTs. When a high voltage is applied to the drain electrode 98 side during OFF periods of the TFT 90, static capacitance coupling occurs between the oxide semiconductor layer 94 and the drain electrode 98. Accordingly, the channel region 94C of the oxide semiconductor layer 94 is activated so that the current leakage increases.

A possible solution for improving the breakdown voltage during OFF periods of the TFTs is to narrow the channel width of the TFTs while increasing the channel length. However, in this case, a problem arises that the ON current is likely to decrease. Since the device size increases for securing the channel length, the layout area of the gate driver increases, so that it is difficult to realize a narrowed frame.

In view of the above, the present inventors arrived at the idea of configuring the peripheral circuit TFTs such that the width or area of the connecting region between the drain electrode and the oxide semiconductor layer (source connecting region Rs) is smaller than the width or area of the connecting region between the source electrode and the oxide semiconductor layer (drain connecting region Rd). This configuration can be realized by, for example, making the width of the drain electrode smaller than the width of the source electrode. In this case, contrary to the configuration of a conventional, common peripheral circuit TFT shown in FIG. 1, the source connecting region Rs and the drain connecting region Rd have asymmetrical shapes. In this specification, such a configuration is also referred to as "asymmetrical source-drain structure".

By thus making the width or area of the drain connecting region smaller than the width or area of the source connecting region, the effect of the drain potential on the channel potential is reduced, so that the current leakage is suppressed, even when a high voltage is applied at the drain side during OFF periods of the TFTs. Further, the current leakage can be suppressed without increasing the channel length, and therefore, a narrower frame can be realized by designing the TFTs so as to have a relatively small size. Furthermore, the area of the source connecting region is sufficiently secured, and the channel length is relatively short. Thus, decrease of the ON current can also be prevented.

The above-described asymmetrical source-drain structure may be selectively applied to some of the peripheral circuit TFTs which are particularly required to have an increased breakdown voltage (i.e., TFTs in which the voltage applied to the drain electrode during OFF periods is relatively high) while a symmetrical source-drain structure such as shown in FIG. 1 is applied to the other TFTs.

Examples of the TFTs which are required to have an increased breakdown voltage include various TFTs in a shift resistor that is a constituent of the monolithic gate driver, whose drain is coupled with the gate of a TFT which is designed so as to be turned on by a boot strap as will be described later (e.g., output buffer transistor). When an asymmetrical source-drain structure is applied only to such specific TFTs, the monolithic gate driver includes both TFTs of the asymmetrical source-drain structure and TFTs of the symmetrical source-drain structure.

Hereinafter, a more specific configuration of the active matrix substrate of an embodiment of the present invention is described.

Embodiment 1

Figure 2:
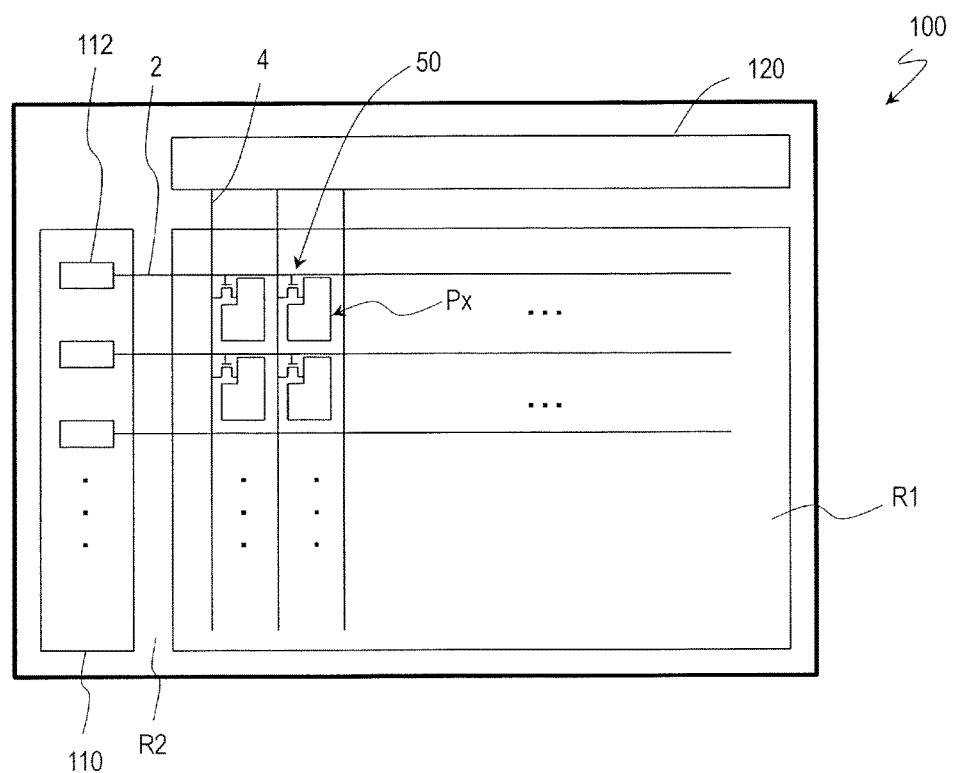
FIG. 2 A plan view showing a configuration of an active matrix substrate of Embodiment 1 of the present invention.

FIG. 2 is a plan view schematically showing the entire configuration of an active matrix substrate 100 of Embodiment 1. The active matrix substrate 100 includes a display region R1 and a frame region R2 that is a non-display region lying outside the display region R1. In the form shown in FIG. 2, the frame region R2 is a band-like region extending along the upper and left edges of the display region R1. Note that, however, the frame region R2 may be in any other form. For example, the frame region R2 may be provided only under the lower edge of the display region 1.

In the display region R1, a plurality of pixels Px are arranged in a matrix. Each of the pixels Px includes a pixel TFT 50 as a switching element. The gate of the pixel TFT 50 is connected with a gate bus line 2 extending in a horizontal direction (row direction). The source of the pixel TFT 50 is connected with a source bus line 4 extending in a vertical direction (column direction). The drain of the pixel TFT 50 is connected with a pixel electrode.

In the frame region R2, a gate driver 110 and a source driver 120 are respectively provided in the band-like region extending along the left and upper edges of the display region R1. In the present embodiment, the gate driver 110 is a monolithic gate driver, which is a circuit integrally formed on the substrate using a production process for production of the pixel TFTs 50 and the like. Note that the source driver 120 may be realized as a driver monolithically formed on the substrate as is the gate driver 110 or may be realized by mounting an IC chip.

The gate driver 110 supplies gate voltage Vg to the gate electrode of a pixel TFT 50 via a gate bus line 2 which is commonly connected with a plurality of pixels Px aligned in a row direction. More specifically, the gate driver 110 includes a plurality of shift resistors 112 which are respectively connected with a plurality of gate bus lines 2 extending parallel with one another along a row direction and is configured to sequentially supply gate-on voltage Vgh to the pixels Px in a row-by-row manner at a predetermined timing.

FIGS. 3(a) and 3(b) are a plan view and a cross-sectional view showing a configuration of some of a plurality of TFTs included in a shift resistor 112 that is a constituent of the gate driver 110 (peripheral circuit TFTs), which are referred to as TFTs 5. The TFTs 5 may be, for example, specific ones of the plurality of TFTs included in the shift resistor 112 which are particularly required to have an increased breakdown voltage.

The TFT 5 of the present embodiment includes, on an insulative substrate 10, a gate electrode 12, a gate insulating layer 20 covering the gate electrode 12, and an island-shaped oxide semiconductor layer 14 extending over the gate electrode 12 with the gate insulating layer 20 interposed therebetween. At the upper surface of the oxide semiconductor layer 14, a source electrode 16 and a drain electrode 18 spaced away from each other are connected. The channel region 14C of the oxide semiconductor layer 14 is present between the source electrode 16 and the drain electrode 18. When ON-voltage Vgh is applied to the gate electrode 12, the TFT 5 is in an ON state so that electrical conduction occurs between the source electrode 16 and the drain electrode 18 via the oxide semiconductor layer 14.

In the TFT 5, the source electrode 16 is part of the source line 6 linearly extending in a vertical direction across the left edge portion of the oxide semiconductor layer 14. In this configuration, the source electrode 16 is a portion corresponding to the connecting region between the source line 6 and the oxide semiconductor layer 14 (source connecting region Rs). The width of the source electrode 16 (or the source connecting region Rs) is equal to the width of the oxide semiconductor layer 14. Note that, in the TFT 5 of the present embodiment, the gate electrode 12 is present under not only the oxide semiconductor layer 14 but also the source line 6.

On the other hand, in comparison to the source electrode 16, the drain electrode 18 has a narrower width so as to lie within the widthwise extent of the oxide semiconductor layer 14. The drain electrode 18 has a shape extending toward the source electrode 16, from right to left in the drawing. At the end of the drain electrode 18, the connecting region Rd connected with the oxide semiconductor layer 14 is provided. Note that, although not shown, a drain line connected at a side of the drain electrode 18 opposite to the source electrode 16 may be provided parallel with the source line 6. This drain line is provided, for example, so as not to cover the oxide semiconductor layer 14 but, however, may slightly overlap the right edge portion of the oxide semiconductor layer 14.

Figure 4:
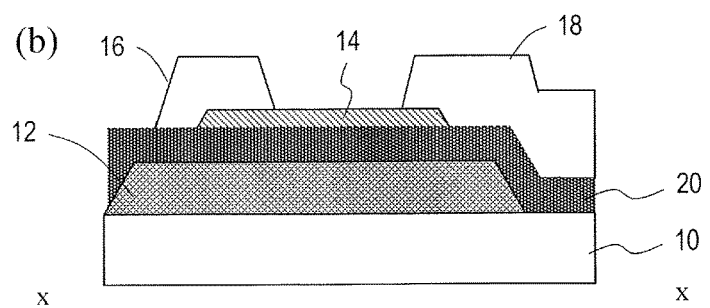
FIG. 4 A plan view for illustrating the relative sizes and areas of a source connecting region and a drain connecting region of the TFT shown in FIGS. 3(a) and 3(b).
Figure 4:
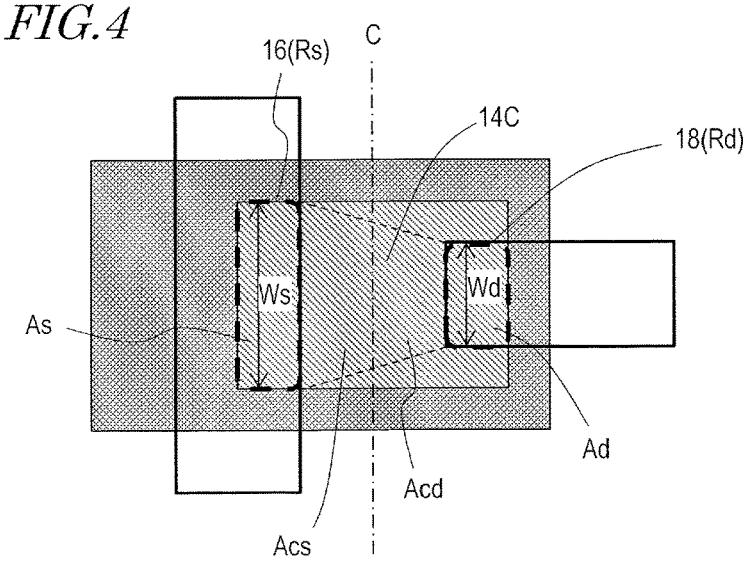

FIG. 4 is a diagram for illustrating the relative dimensions of the TFT 5, including the width Ws of the source electrode 16 (or the source connecting region Rs), the width Wd of the drain electrode 18 (or the drain connecting region Rd), the area As of the source connecting region Rs, and the area Ad of the drain connecting region Rd.

As shown in FIG. 4, the width Wd of the drain connecting region Rd is smaller than the width We of the source connecting region Rs. The area Ad of the drain connecting region Rd is smaller than the area As of the source connecting region Re. This asymmetrical source-drain structure enables to suppress the off leakage current even when a high voltage is applied at the drain side.

To effectively suppress the off leakage current while preventing decrease of the ON current, the width Wd of the drain connecting region Rd is set to a value which is, for example, not less than 0.5 times and not more than 0.8 times the width Ws of the source connecting region Rs. The area Ad of the drain connecting region Rd is set to a value which is, for example, not less than 0.5 times and not more than 0.8 times the area As of the source connecting region Rs.

In this configuration, the effective channel region 14C formed between the source connecting region Rs and the drain connecting region Rd has a trapezoidal shape in which an edge of the source electrode 16 is the lower base and an edge of the drain electrode 18 is the upper base. Now, imagine a line C which passes through the source-drain central portion in terms of the channel current direction and which is perpendicular to the channel current direction. This line C divides the channel region 14C into an area Acs and an area Acd. The area Acd of the effective channel region on the drain electrode 18 side is smaller than the area Acs of the effective channel region on the source electrode 16 side.

The effective channel region 14C explained above is, for the sake of convenience, a trapezoidal region surrounded by an edge of the source connecting region Re, an edge of the drain connecting region Rd, and two lines extending between the ends of these edges. However, in actuality, a portion of the oxide semiconductor layer 14 outside but near the trapezoidal region can also function as the channel of the TFT 5.

Figure 3:
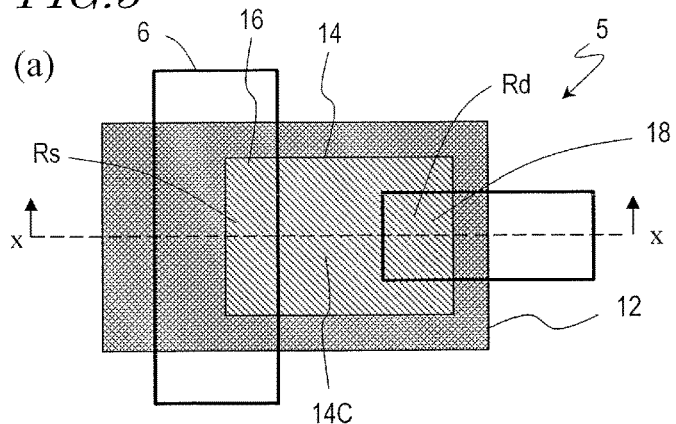
FIG. 3 Diagrams showing a configuration of a TFT of Embodiment 1. (a) is a plan view. (b) is a cross-sectional view taken along line x-x of (a).
Figure 5:
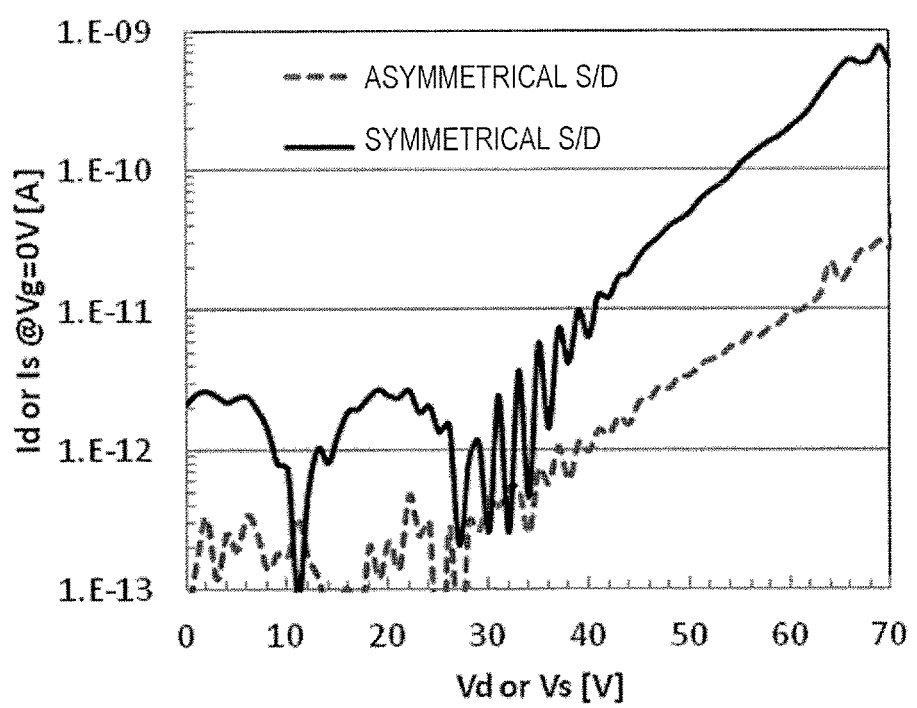
FIG. 5 A graph illustrating the magnitude of the drain current (current leakage) relative to the largeness of the voltage applied during OFF periods in the case of an asymmetrical source-drain structure (asymmetrical S/D) and in the case of a symmetrical source-drain structure (symmetrical S/D).

FIG. 5 illustrates the magnitude of the drain current (i.e., the magnitude of the current leakage) relative to the largeness of the source voltage or drain voltage applied during OFF periods (Vg=0) in a case where an asymmetrical source-drain structure (asymmetrical S/D: FIG. 3) is used in the oxide semiconductor TFT and in a case where a symmetrical source-drain structure (symmetrical S/D: FIG. 1) is used in the oxide semiconductor TFT. As seen from a comparison between a graph of a broken line (asymmetrical S/D) and a graph of a solid line (symmetrical S/D) in FIG. 5, the current leakage is better suppressed in the case of the asymmetrical S/D.

Figure 6:
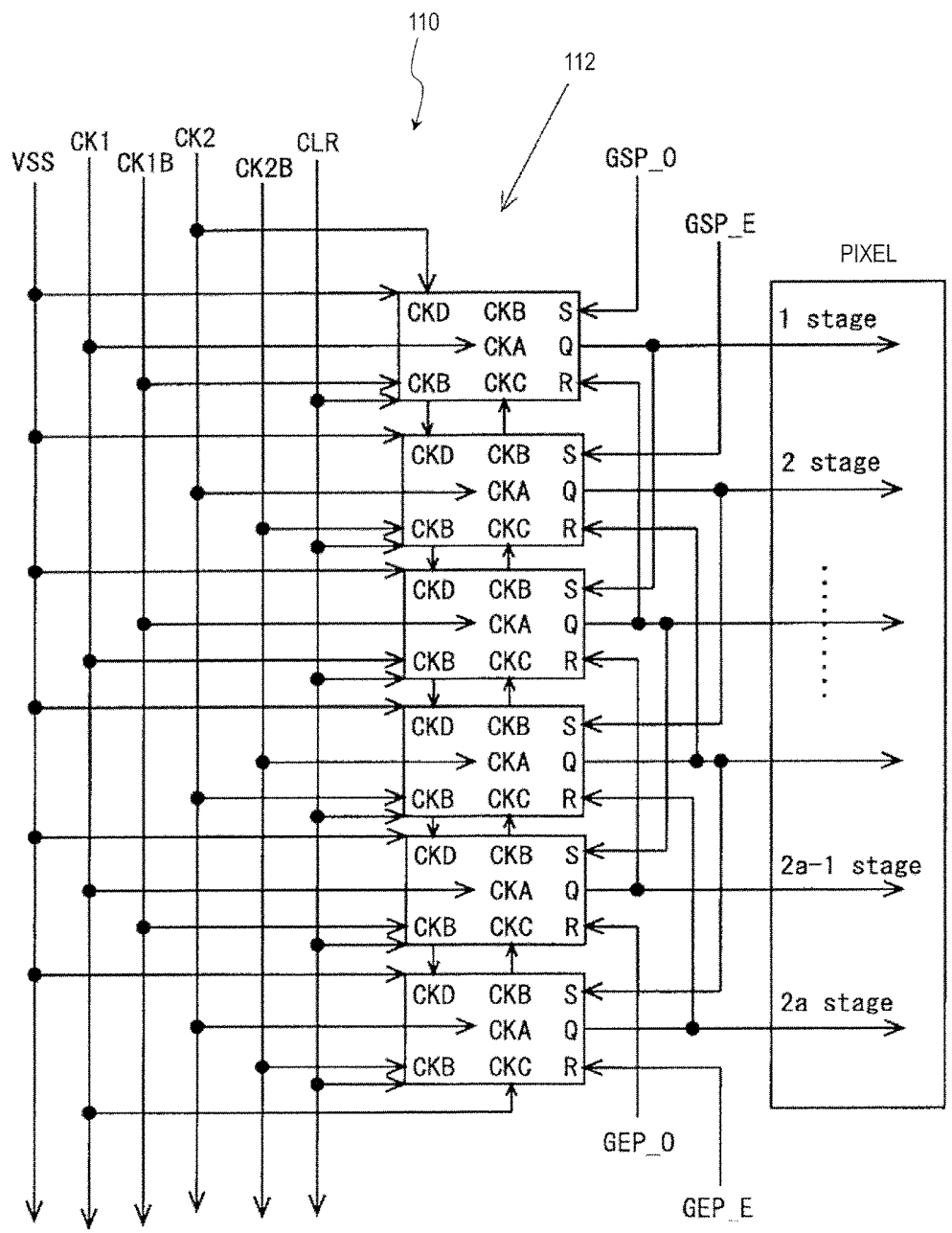
FIG. 6 A circuit diagram showing a monolithic gate driver of Embodiment 1.
Figure 7:
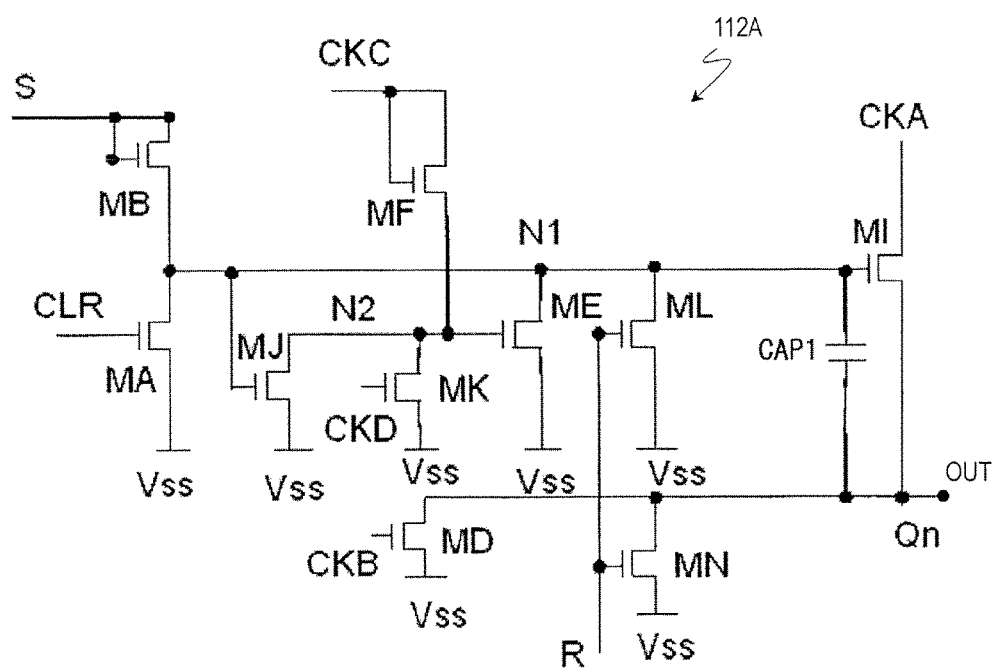
FIG. 7 A diagram showing a bistable circuit included in the gate driver of Embodiment 1.

Next, a configuration example of the gate driver 110 shown in FIG. 2 is described with reference to FIG. 6 and FIG. 7. Note that a configuration similar to the gate driver 110 shown in FIG. 6 and FIG. 7 is disclosed in WO 2011/024499 (Patent Document 2). The entire disclosure of WO 2011/024499 is incorporated by reference in this specification.

FIG. 6 is a diagram showing a circuit configuration example of the gate driver 110. As shown in the drawing, the gate driver 110 is formed by shift resistors 112 of multiple stages. The shift resistor 112 of each stage corresponds to respective one of the rows of the pixel matrix.

The shift resistor 112 includes 2a bistable circuits. Each of the bistable circuits is configured to selectively output one of the two stable states according to a trigger signal. Each of the bistable circuits has an input terminal for receiving four-phase clock signal CKA, CKB, CKC, CKD, an input terminal for receiving set signal S, an input terminal for receiving reset signal R, an input terminal for receiving clear signal CLR, an input terminal for receiving low-potential DC voltage VSS, and an output terminal for outputting state signal Q.

A perimetral portion of the frame region includes trunk lines for gate clock signals (first gate clock signal CK1, second gate clock signal CK1B, third gate clock signal CK2, and fourth gate clock signal CK2B), a trunk line for low-potential DC voltage VSS, and a trunk line for clear signal CLR.

FIG. 7 is a circuit diagram showing a more specific configuration of a bistable circuit 112A (which is part of the shift resistor 112 corresponding to one stage). As shown in FIG. 7, the bistable circuit 112A includes 10 thin film transistors (MA, MB, MI, MF, MJ, MK, ME, ML, MN and MD) and a capacitor CAP1. This bistable circuit 112A has an input terminal for receiving clock signal CKA, CKB, CKC, CKD, an input terminal for receiving set signal S, an input terminal for receiving reset signal R, an input terminal for receiving clear signal CLR, and an output terminal OUT for outputting state signal Qn.

The source terminal of the thin film transistor MB, the drain terminal of the thin film transistor MA, the gate terminal of the thin film transistor MJ, the drain terminal of the thin film transistor ME, the drain terminal of the thin film transistor ML, the gate terminal of the thin film transistor MI, and one end of the capacitor CAP1 are coupled with one another. Note that a wire section at which these are coupled with one another is referred to as "first node" for the sake of convenience and designated by reference mark "N1" in the drawing.

The drain terminal of the thin film transistor MJ, the drain terminal of the thin film transistor MK, the source terminal of the thin film transistor MF, and the gate terminal of the thin film transistor ME are coupled with one another. Note that a wire section at which these are coupled with one another is referred to as "second node" for the sake of convenience and designated by reference mark "N2" in the drawing.

In this configuration, the thin film transistor MA shown on the left side in the drawing sets the potential of the first node N1 to a low level when clear signal CLR is at a high level. Meanwhile, the thin film transistor MB sets the potential of the first node N1 to a high level when set signal S is at a high level.

The thin film transistor MI shown on the right side in the drawing functions as an output buffer transistor. The thin film transistor MI supplies the potential of first clock signal CKA to the output terminal when the potential of the first node N1 is at a high level. The thin film transistor MF shown in the upper central part of the drawing sets the potential of the second node N2 to a high level when third clock signal CKC is at a high level.

The thin film transistor MJ sets the potential of the second node N2 to a low level when the potential of the first node N1 is at a high level. If the second node N2 transitions to a high level so that the thin film transistor ME transitions to an ON state during a period where a gate bus line coupled with the output terminal OUT of the bistable circuit 112A is selected, the potential of the first node N1 will decrease so that the thin film transistor MI will transition to an OFF state. The thin film transistor MJ is provided in order to prevent such a phenomenon.

The thin film transistor MK sets the potential of the second node N2 to a low level when fourth clock signal CKD is at a high level. If the thin film transistor ME is not provided, the potential of the second node 32 will always be at a high level during a period other than the selected period so that a bias voltage will be incessantly applied to the thin film transistor ME. Accordingly, the threshold voltage of the thin film transistor ME will increase so that the thin film transistor ME will not sufficiently function as a switch. The thin film transistor MK is provided in order to prevent such a phenomenon.

The thin film transistor ME sets the potential of the first node N1 to a low level when the potential of the second node N2 is at a high level. The thin film transistor ML sets the potential of the first node N1 to a low level when reset signal R is at a high level. The thin film transistor MN sets the potential of the output terminal to a low level when reset signal R is at a high level. The thin film transistor MD sets the potential of the output terminal OUT to a low level when second clock CKB is at a high level. During a period where a gate bus line coupled with the output terminal OUT of this bistable circuit 112A is selected, the capacitor CAP1 serves as a storage capacitance for keeping the potential of the first node N1 at a high level.

In this configuration, the first node N1 shown in FIG. 7 is a node whose potential is to be boosted by a boot strap so as to reach or exceed the power supply voltage. Note that the boot strap in this circuit configuration means the operation of turning on the output buffer transistor MI while the gate voltage is raised to a potential exceeding set signal S by utilization of voltage application to the gate terminal via a parasitic capacitance which is attributed to an increase of the source potential of the output buffer transistor MI and storage of electricity in the capacitor CAP1.

The drain side and the source side of the thin film transistors MA, ME, ML which pull down the first node N1 are coupled with the first node N1 and VSS, respectively. In the boot strap operation, when the first node N1 transitions to a high voltage, each of the above-described thin film transistors MA, ME, ML is in an OFF state, and furthermore, a high voltage is applied between the drain and the source. In this case, if the channel length of each of the thin film transistors MA, ME, ML is short so that the off-state breakdown voltage is low, a normal OFF state will not be maintained anymore. As a result, the potential of the first node N1 will decrease so that there is a probability that the potential decreases and a selection/non-selection operation for the driver fails.

Clock signal CKA whose duty ratio is 50% is input to the drain terminal of the output buffer transistor MI. If this stage is not selected, clock signal CKA should not be output as state signal Qn. When the off-state breakdown voltage of this transistor MI is low, the voltage of clock signal CKA is output as state signal Qn even when this stage is not selected. This can cause an operation error.

Therefore, the above-described thin film transistors are required to have high breakdown voltages. The off-state breakdown voltages of the thin film transistors have a tendency to increase as the channel length increases so that the operation of the driver is more readily secured but, meanwhile, the area of the thin film transistors increases, so that the layout area of the gate driver increases. This leads to increase in external dimensions of the display panel, so that the demand for size reduction in devices cannot be met.

In view of such, the configuration of the TFT 5 of the present embodiment which has been described with reference to FIG. 3 and FIG. 4 (asymmetrical source-drain structure) is applied to a thin film transistor which is required to have a sufficiently high off-state voltage. This enables to improve the off-state breakdown voltage without increasing the device size. To the thin film transistors MD, MF, MN which are not particularly required to have voltage withstandability, the configuration of the TFT 90 of the comparative example shown in FIG. 1 may be applied.

Although an exemplary configuration of the monolithic gate driver 110 has been described above, the monolithic gate driver 110 may have a different configuration as a matter of course. Also in this case, the above-described asymmetrical source-drain structure may be applied to an arbitrary TFT in the monolithic gate driver to which a high voltage can be applied at the drain side during OFF periods. For example, it is preferred that the asymmetrical source-drain structure is applied to a TFT in which the voltage applied at the drain side during OFF periods can be 20 V to 60 V.

Hereinafter, a method for forming a peripheral circuit TFT 5 according to the present embodiment is described with reference to FIGS. 3(*a*) and 3(*b*). This peripheral circuit TFT 5 can be formed using a formation process which is applied to the pixel TFTs 50 (see FIG. 2) provided in the display region R1.

First, a gate electrode 12 is formed on a substrate 10. More specifically, a metal film (Mo, Ti, Al, Ta, Cr, Au, or the like) which is to form a gate electrode is formed on a glass substrate to a thickness of 100-300 nm using a sputtering apparatus. This metal film may have a multilayer structure (e.g., Ti/Al/Ti). After formation of the film, the metal film is patterned by photolithography, whereby the gate electrode 12 and other components can be obtained.

Next, a gate insulating layer 20 is formed. More specifically, a silicon oxide film $SiO_2$ or a silicon nitride film $SiN_x$ is formed at 300-400° C. to a thickness of 300-400 nm using a plasma CVD apparatus, whereby the gate insulating layer 20 is obtained. The gate insulating layer 20 may have a multilayer structure of $SiO_2$ and $SiN_x$.

Next, an oxide semiconductor layer 14 is formed as the active layer. More specifically, a thin film of an oxide semiconductor (In—Ga—Zn—O based semiconductor, In—Zn—O based semiconductor, ZnO based semiconductor, or the like) is formed at 200-400° C. to a thickness of 40-50 nm using a sputtering apparatus. Thereafter, inert argon gas Ar (flow rate: 100-300 sccm) and oxygen gas $O_2$ (flow rate: 5-20 sccm) may be supplied into the sputtering apparatus. Note that the oxide semiconductor film may be formed through an application process, rather than sputtering, to a thickness of 40-50 nm. After formation of the film, the oxide semiconductor film is patterned by photolithography, whereby an island-shaped oxide semiconductor layer 14 which is to form the active layer of each TFT can be obtained. The widthwise dimension of the oxide semiconductor layer 14 is set to, for example, 5 μm to 50 μm. The dimension in the channel current direction of the oxide semiconductor layer 14 is set to, for example, 10 μm to 20 μm.

Next, source and drain electrodes 16, 18 are formed. More specifically, a metal film (Mo, Ti, Al, Ta, Cr, Au, or the like) is formed to a thickness of 100-300 nm using a sputtering apparatus. This metal film is patterned by photolithography, whereby source and drain electrodes 16, 18 are obtained. In this step, the TFT 5 is completed. Note that the metal film may have a multilayer structure (e.g., Ti/Al/Ti).

In this step, the shape and arrangement of the source and drain electrodes 16, 18 are appropriately selected such that the width and area of the drain connecting region Rd are smaller than the width and area of the source connecting region Rs as previously described with reference to FIG. 4. To this end, when a resist which is made of a photosensitive resin, for example, is used for etching of the metal film in the photolithography process, the pattern and alignment of the mask which determine the resist pattern may be appropriately selected.

Specifically, the width of the source connecting region Rs (which is equivalent to the width of the oxide semiconductor layer 14 in the present embodiment) may be, for example, 5 μm to 50 μm. The width of the drain connecting region Rd may be, for example, 2.5 μm to 40 μm. The distance between the source and the drain (i.e., the channel length of the TFT 5) may be, for example, 5 μm to 15 μm.

Thereafter, when necessary, a passivation layer (not shown) is formed as a protection layer that covers the TFTs 5. More specifically, an oxide film $SiO_2$ or a nitride film $SiN_x$ is formed at 200-300° C. to a thickness of 200-300 nm using a plasma CVD apparatus. The protection layer may have a multilayer structure of $SiO_2$ and $SiN_x$.

Thereafter, a heat treatment is performed at 200-400° C. for 1-2 hours in dry air or atmospheric air. This heat treatment can improve the device characteristics of the TFT 5.

The above-described process is common to production of the TFTs 5 and production of the pixel TFTs 50. Corresponding components of the pixel TFTs 50 can also be produced through the above-described process.

To manufacture the active matrix substrate 100, the above-described heat treatment may be followed by, for example, the step of forming an organic interlayer insulating film, the step of forming a transparent common electrode, the step of forming a pixel electrode with an insulation layer interposed therebetween, and the like, in the display region R1. These steps can be performed according to a known method and, therefore, the descriptions thereof are herein omitted.

The above-described oxide semiconductor layer 14 includes, for example, a semiconductor which is based on In—Ga—Zn—O elements (hereinafter, abbreviated as "In—Ga—Zn—O based semiconductor"). Here, the In—Ga—Zn—O based semiconductor is a ternary oxide consisting of In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. In the present embodiment, the oxide semiconductor layer 14 may be an In—Ga—Zn—O based semiconductor layer which includes In, Ga and Zn in a proportion of In:Ga:Zn=1:1:1, for example.

A TFT which includes an In—Ga—Zn—O based semiconductor layer has high mobility (20 times or more as compared with an a-Si TFT) and low current leakage (less than 1/100 as compared with an a-Si TFT) and is therefore suitably used as a driver TFT and a pixel TFT. When a TFT which includes an In—Ga—Zn—O based semiconductor layer is used, the power consumption of a display device can be greatly reduced.

The In—Ga—Zn—O based semiconductor may be amorphous or may include a crystalline portion. As the crystalline In—Ga—Zn—O based semiconductor, a crystalline In—Ga—Zn—O based semiconductor in which the c-axis is oriented generally perpendicular to the layer surface is preferred. The crystalline structure of such an In—Ga—Zn—O based semiconductor is disclosed in, for example, Japanese Laid-Open Patent Publication No. 2012-134475 (Patent Document 1). The entire disclosure of Japanese Laid-Open Patent Publication No. 2012-134475 is incorporated by reference in this specification.

The oxide semiconductor layer 14 may include a different oxide semiconductor instead of the In—Ga—Zn—O based semiconductor. For example, the oxide semiconductor layer 14 may include a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, a CdO (cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like.

In the case where a liquid crystal panel is manufactured using the above-described active matrix substrate 100 of the present embodiment, it is only necessary to use a configuration where a counter substrate is provided separately from the active matrix substrate 100 and a liquid crystal layer is provided between the active matrix substrate 100 and the counter substrate.

In the case of a vertical electric field mode, the counter substrate can be realized by providing on a glass substrate a counter electrode which is formed by a transparent electrically-conductive film (e.g., a 100 nm thick ITO film). In the case of color display, the counter substrate may be provided with a color filter of three colors, R, G and B, for example. Further, a photospacer for maintaining the gap between the counter substrate and the active matrix substrate 100 may be provided on the counter substrate. Note that the color filter and the photospacer may be provided in the active matrix substrate 100.

A liquid crystal panel can be manufactured by, for example, combining together the active matrix substrate 100 and the counter substrate using an annular sealant provided in the perimetral portion such that a gap is formed between the substrates and thereafter injecting a liquid crystal material into the gap surrounded by the sealant between the substrates. Alternatively, a liquid crystal panel may be manufactured by dropping a liquid crystal material on a counter substrate after a sealant and a photospacer have been provided and thereafter combining together the active matrix substrate 100 and the counter substrate. In a case where a plurality of liquid crystal panels are manufactured using a single mother glass plate, the step of dividing into respective liquid crystal panels is carried out.

In the case of manufacturing a transmissive liquid crystal display device, a backlight unit is provided on the rear face (TFT substrate side) of the above-described liquid crystal panel. The backlight unit may include various optical elements, such as a diffuser film.

In the pixel TFT 50, an example which uses an asymmetrical source-drain structure is disclosed in WO 2014/069260 of the present applicant. In the active matrix substrate 100 of the present embodiment, the above-described asymmetrical source-drain structure may be applied not only to the peripheral circuit TFTs 5 but also to the pixel TFTs 50.

Embodiment 2

Hereinafter, an active matrix substrate of Embodiment 2 is described. A major difference of the active matrix substrate of Embodiment 2 from the active matrix substrate 100 of Embodiment 1 is that at least some of TFTs that are constituents of the monolithic gate driver (peripheral circuit TFTs), which are referred to as TFTs 52, have a top gate type TFT configuration where the gate electrode 12 is provided at an upper level than the oxide semiconductor layer 14. Note that, in the following description, components which are equivalent to those of the active matrix substrate 100 of Embodiment 1 are designated by the same reference numerals, and repetitive descriptions thereof are avoided.

Figure 8:
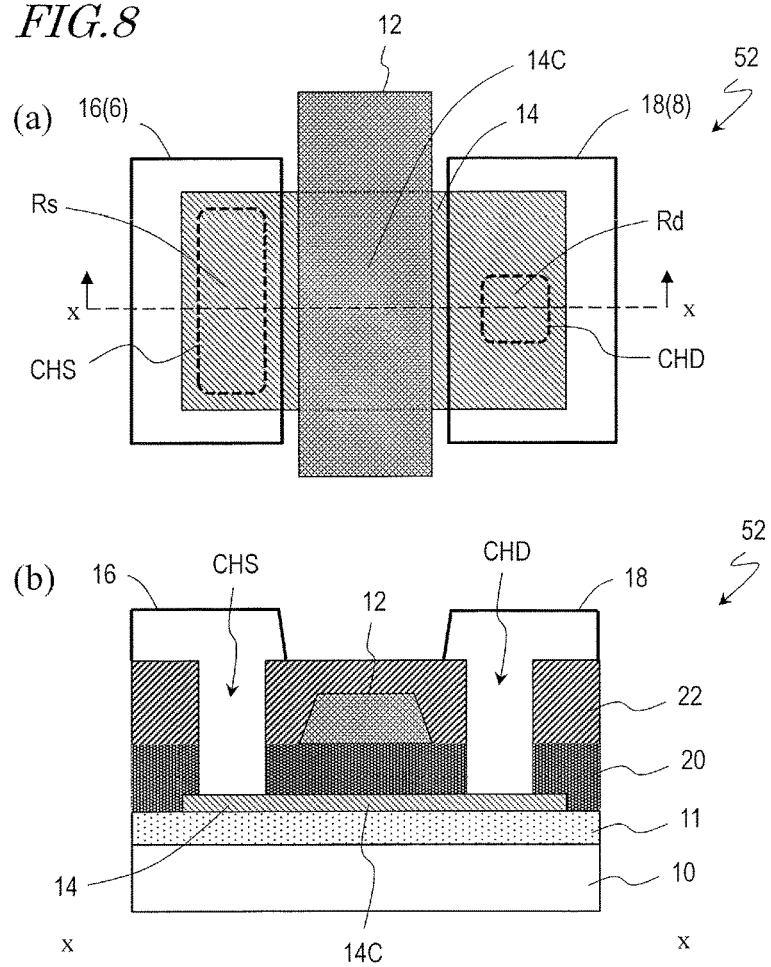
FIG. 8 Diagrams showing a configuration of a TFT of Embodiment 2. (a) is a plan view. (b) is a cross-sectional view taken along line x-x of (a).

FIGS. 8(a) and 8(b) are a plan view and a cross-sectional view showing a configuration of some of a plurality of TFTs included in a shift resistor that is a constituent of the monolithic gate driver (peripheral circuit TFTs), which are referred to as TFTs 52, in an active matrix substrate of the present embodiment. The TFTs 52 may be, for example, specific ones of the plurality of TFTs included in the shift resistor which are particularly required to have an increased breakdown voltage.

The TFT 52 includes, on an insulative substrate 10, a buffer layer 11 (e.g., a 100-300 nm thick $SiO_z$ or $SiN_x$ film), an island-shaped oxide semiconductor layer 14, a gate insulating layer 20 covering the oxide semiconductor layer 14, and a gate electrode 12 arranged so as to extend over the oxide semiconductor layer 14 with the gate insulating layer interposed therebetween. Further, an interlayer insulating layer 22 (e.g., a 200-300 nm thick $SiO_2$ or $SiN_x$ film) is provided so as to cover the gate electrode 12.

Further, a drain electrode 16 and a source electrode 18 are provided on the interlayer insulating layer 22. The drain electrode 16 and the source electrode 18 are connected with the upper surface of the oxide semiconductor layer 14 respectively through a source contact hole CHS and a drain contact hole CHD which are arranged so as to penetrate through the gate insulating layer 20 and the interlayer insulating layer 22.

In the TFT 52, a connecting region between the source electrode 16 and the oxide semiconductor layer 14 (source connecting region Re) is formed in the source contact hole CHS, and a connecting region between the drain electrode 18 and the oxide semiconductor layer 14 (drain connecting region Rd) is formed in the drain contact hole CHD. Note that the source electrode 16 and the drain electrode 18 may be part of the source line 6 and part of the drain line 8 extending in a width direction.

The source connecting region Rs and the drain connecting region Rd provided at opposite ends of the oxide semiconductor layer 14 so as to be separated from each other. The channel region 14C of the oxide semiconductor layer 14 is provided between the source connecting region Rs and the drain connecting region Rd.

Figure 9:
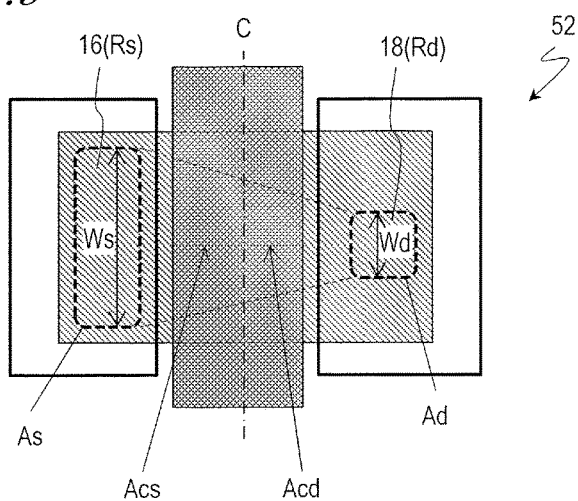
FIG. 9 A plan view for illustrating the relative sizes and areas of a source connecting region and a drain connecting region of the TFT shown in FIGS. 8(a) and 8(b).

FIG. 9 is a diagram for illustrating the relative dimensions of the TFT 52, including the width Ws of the source connecting region Rs, the width Wd of the drain connecting region Rd, the area As of the source connecting region Rs, and the area Ad of the drain connecting region Rd.

As shown in FIG. 9, the width Wd of the drain connecting region Rd is smaller than the width We of the source connecting region Rs as in the TFT 5 of Embodiment 1. The area Ad of the drain connecting region Rd is smaller than the area As of the source connecting region Rs. When the channel region 14C is divided by a center line C, the area of the effective channel region on the drain electrode 18 side, Acd, is smaller than the area of the effective channel region on the source electrode 16 side, Acs, as in the TFT 5 of Embodiment 1.

To effectively suppress the off leakage current while preventing decrease of the ON current, the width Wd of the drain connecting region Rd is set to a value which is, for example, not less than 0.5 times and not more than 0.8 times the width Ws of the source connecting region Rs as in the TFT 5 of Embodiment 1.

In the present embodiment, the width of the oxide semiconductor layer 14 and the width We of the source connecting region Rs may be different from each other. Typically, the shape of the source contact hole CHS is determined such that the width We of the source connecting region Rs is smaller than the width of the oxide semiconductor layer 14. Note that, however, the width of the source contact hole CHS may be greater than the width of the oxide semiconductor layer 14. In this case, the width We of the source connecting region Re is equal to the width of the oxide semiconductor layer 14.

Thus, even in the top gate type TFT 52, using an asymmetrical source-drain structure enables to suppress an off leakage current which occurs when a high voltage is applied to the drain side. It was found that, also in the TFT 52 of the present embodiment, the off leakage current is smaller when the asymmetrical source-drain structure (asymmetrical S/D) is used than when the symmetrical source-drain structure (symmetrical S/D) is used, as in the graph shown in FIG. 5.

Hereinafter, the production process of the TFT 52 is described with reference to FIGS. 8(a) and 8(b).

First, a buffer layer 11 is formed on an insulative substrate 10. The buffer layer 11 can be realized by, for example, forming a 100-300 nm thick $SiO_2$ or $SiN_x$ film at 200-300° C. using a plasma CVD apparatus.

Then, an oxide semiconductor layer 14 is formed through the same process as that for the TFT 5 of Embodiment 1. Further, a gate insulating layer 20 is formed on the oxide semiconductor layer 14 through the same process as that for the TFT 5. Further, a gate electrode 12 is formed through the same process as that for the TFT 5 so as to extend over the oxide semiconductor layer 14 with the gate insulating layer 20 interposed therebetween.

Thereafter, an interlayer insulating layer 22 is formed. More specifically, the interlayer insulating layer 22 is realized by forming a $SiO_2$ or $SiN_x$ film at 200-300° C. to a thickness of 200-300 nm using a plasma CVD apparatus. The interlayer insulating layer 22 may have a multilayer structure of a $SiO_2$ film and a $SiN_x$ film.

Thereafter, a pair of contact holes CHS, CHD penetrating through the interlayer insulating layer 22 and the gate insulating layer 20 are formed by photolithography and dry or wet etching. Here, the contact holes CHS, CHD are formed such that the area and width of the drain contact hole CHD are smaller than the area and width of the source contact hole CHS.

Thereafter, a source electrode 16 and a drain electrode 18 are formed through the same process as that for the TFT 5.

The source electrode 16 and the drain electrode 18 may be part of the source line 6 and part of the drain line 8, respectively. The source electrode 16 and the drain electrode 18 are arranged so as to entirely cover the source contact hole CHS and the drain contact hole CHD, respectively. In this step, the source electrode 16 is connected with the oxide semiconductor layer 14 inside the source contact hole CHS, whereby a source connecting region Rs is formed. The drain electrode 18 is connected with the oxide semiconductor layer 14 inside the drain contact hole CHD, whereby a drain connecting region Rs is formed.

The width and area of the source connecting region Rs are determined depending on the size of the source contact hole CHS. The width and area of the drain connecting region Rd is determined depending on the size of the drain contact hole CHD. Since the size of the respective contact holes is determined as described above, the width and area of the drain connecting region Rd are smaller than the width and area of the source connecting region Rs.

Thereafter, the same heat treatment as that for the TFT 5 may be performed. This heat treatment can improve the device characteristics of the TFT 52.

The above-described process is common to production of the TFTs 52 and production of the pixel TFTs in the display region. Corresponding components of the pixel TFTs can also be produced through the above-described process. In the present embodiment, the pixel TFTs are produced together with the peripheral circuit TFTs 52 so as to have a top gate type TFT configuration.

Embodiment 3

Hereinafter, an active matrix substrate of Embodiment 3 is described. A major difference of the active matrix substrate of Embodiment 3 from the active matrix substrate 100 of Embodiment 1 is that, in at least some of TFTs that are constituents of the monolithic gate driver (peripheral circuit TFTs), which are referred to as TFTs 53, an etch stop layer 24 is provided at an upper level than the oxide semiconductor layer 14. Note that, in the following description, components which are equivalent to those of the TFT substrate 100 are designated by the same reference numerals, and repetitive descriptions thereof are avoided.

FIGS. 10(a) and 10(b) are a plan view and a cross-sectional view showing a configuration of some of a plurality of TFTs included in a shift resistor that is a constituent of the monolithic gate driver (peripheral circuit TFTs), which are referred to as TFTs 53, in an active matrix substrate of the present embodiment. The TFTs 53 may be, for example, specific ones of the plurality of TFTs included in the shift resistor which are particularly required to have an increased breakdown voltage.

The TFT 53 includes, on the insulative substrate 10, a gate electrode 12, a gate insulating layer 20 covering the gate electrode 12, and an island-shaped oxide semiconductor layer 14 arranged so as to extend over the gate electrode 12 with the gate insulating layer 20 interposed therebetween.

Further, an etch stop layer 24, which is made of $SiO_2$ or the like, is provided on the oxide semiconductor layer 14. The etch stop layer 24 is provided for the purpose of preventing, in patterning a metal film in a source-drain formation step which will be described later, etching damage from reaching the channel region 14C of the oxide semiconductor layer 14.

In the construction shown in FIGS. 10(a) and 10(b), the etch stop layer 24 is arranged so as to entirely cover the oxide semiconductor layer 14. Note that, however, a source contact hole CHS and a drain contact hole CHD are respectively provided at positions corresponding to the left and right ends of the oxide semiconductor layer 14 so as to penetrate through the etch stop layer 24. The width and area of the source contact hole CHS are greater than the width and area of the drain contact hole CHD.

The source electrode 16 and the drain electrode 18, which are spaced away from each other, are connected with the oxide semiconductor layer 14 via the source contact hole CHS and the drain contact hole CHD. In this configuration, a connecting region between the source electrode 16 and the oxide semiconductor layer 14 (source connecting region Rs) is formed in the source contact hole CHS, and a connecting region between the drain electrode 18 and the oxide semiconductor layer 14 (drain connecting region Rd) is formed in the drain contact hole CHD. Note that the source electrode 16 and the drain electrode 18 may be part of the source line 6 and part of the drain line 8 extending in a vertical direction.

The source connecting region Rs and the drain connecting region Rd provided at opposite ends of the oxide semiconductor layer 14 so as to be separated from each other. The channel region 14C of the oxide semiconductor layer 14 is provided between the source connecting region ea and the drain connecting region Rd.

Figure 11:
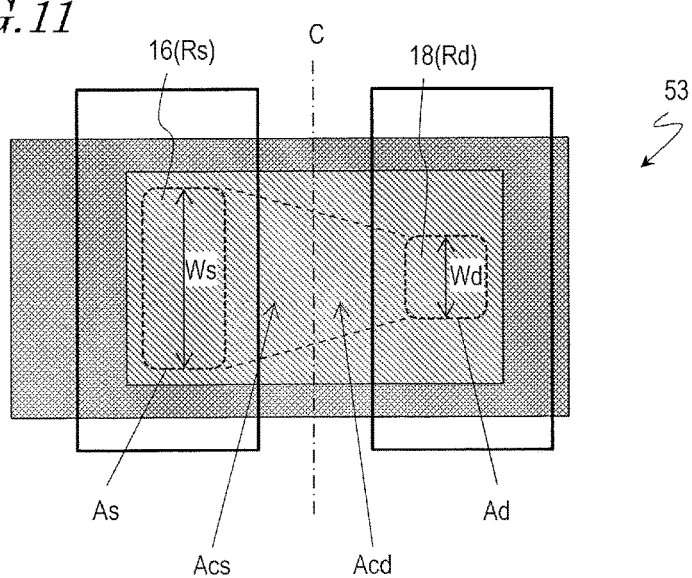
FIG. 11 A plan view for illustrating the relative sizes and areas of a source connecting region and a drain connecting region of the TFT shown in FIGS. 10(a) and 10(b).

FIG. 11 is a diagram for illustrating the relative dimensions of the TFT 53, including the width Ws of the source connecting region Rs, the width Wd of the drain connecting region Rd, the area As of the source connecting region Re, and the area Ad of the drain connecting region Rd.

As shown in FIG. 11, also in the present embodiment, the width Wd of the drain connecting region Rd is smaller than the width We of the source connecting region Rs. The area Ad of the drain connecting region Rd is smaller than the area As of the source connecting region Rs. When the channel region 14C is divided by a center line C, the area of the effective channel region on the drain electrode 18 side, Acd, is smaller than the area of the effective channel region on the source electrode 16 side, Acs, as in the TFT 52 of Embodiment 2.

Thus, using an asymmetrical source-drain structure in the TFT 53 that has the etch stop layer 24 enables to suppress an off leakage current which occurs when a high voltage is applied to the drain side. It was found that, also in the TFT 53 of the present embodiment, the off leakage current is smaller when the asymmetrical source-drain structure (asymmetrical S/D) is used than when the symmetrical source-drain structure (symmetrical S/D) is used, as in the graph shown in FIG. 5.

Figure 10:
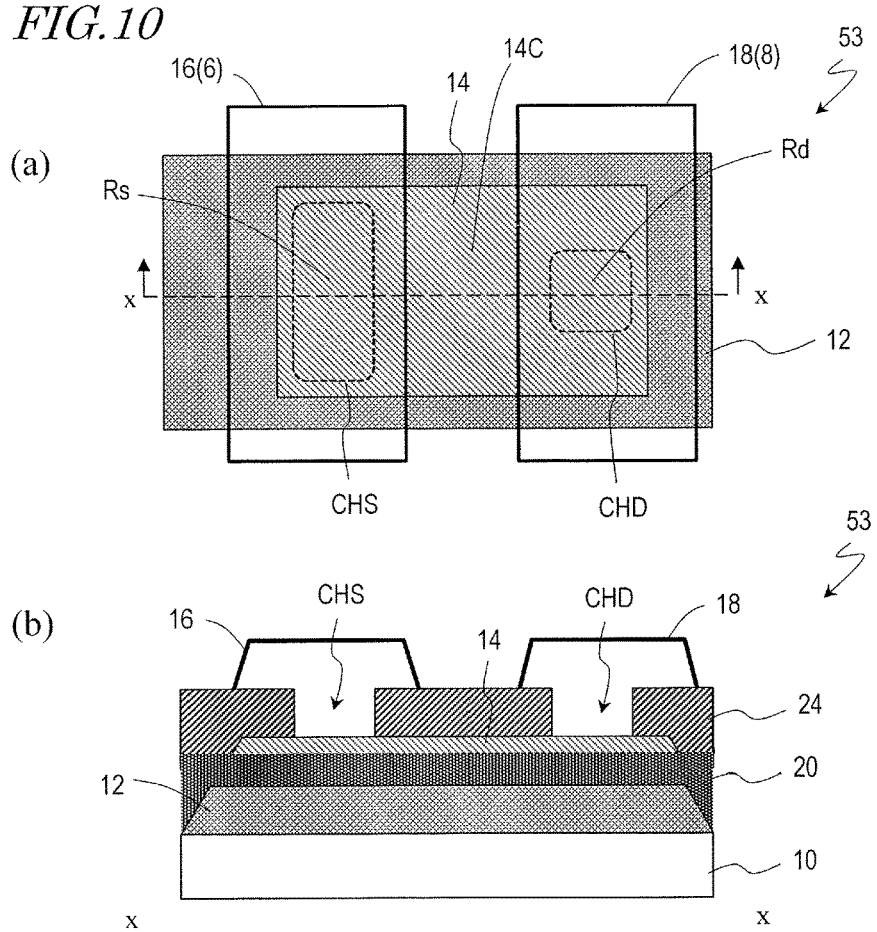
FIG. 10 Diagrams showing a configuration of a TFT of Embodiment 3. (a) is a plan view. (b) is a cross-sectional view taken along line x-x of (a).

Hereinafter, the production process of the TFT 53 is described with reference to FIG. 10.

A gate electrode 12, a gate insulating layer 20, and an oxide semiconductor layer 14 are formed on an insulative substrate 10 through the same process as that for the TFT 5 of Embodiment 1.

Thereafter, an etch stop layer 24 is formed so as to cover at least part of the oxide semiconductor layer 14 which is to form the channel region. More specifically, a $SiO_2$ film is formed at 300-400° C. to a thickness of 100-400 nm using a plasma CVD apparatus, and a pair of contact holes CHS, CHD are formed by photolithography in the $SiO_2$ film, whereby the etch stop layer 24 is obtained. In this step, the contact holes CHS, CHD are formed such that the area and width of the drain contact hole CHD are smaller than the area and width of the source contact hole CHS.

Thereafter, a source electrode 16 and a drain electrode 18 are formed through the same process as that for the TFT 5. The source electrode 16 and the drain electrode 18 are arranged, as part of the source line 6 and part of the drain line 8, so as to entirely cover the source contact hole CHS and the drain contact hole CHD, respectively. In this step, the source electrode 16 is connected with the oxide semiconductor layer 14 inside the source contact hole CHS, whereby a source connecting region Rs is formed. The drain electrode 18 is connected with the oxide semiconductor layer 14 inside the drain contact hole CHD, whereby a drain connecting region Rs is formed.

The width and area of the source connecting region Rs are determined depending on the size of the source contact hole CHS. The width and area of the drain connecting region Rd are determined depending on the size of the drain contact hole CHD. Since the size of the respective contact holes is determined as described above, the width and area of the drain connecting region Rd are smaller than the width and area of the source connecting region Rs.

Thereafter, when necessary, a protection layer (not shown) may be provided as in the TFT 5 of Embodiment 1. The protection layer may be realized by forming an oxide film $SiO_2$ or a nitride film $SiN_x$ at 200-300° C. to a thickness of 200-300 nm using a plasma CVD apparatus. The protection film may have a multilayer structure of $SiO_2$ and $SiN_x$. Further, the same heat treatment as that for the TFT 5 of Embodiment 1 may be performed. This heat treatment can improve the device characteristics of the TFT 53.

The above-described process is common to production of the TFTs 53 and production of the pixel TFTs in the display region. Corresponding components of the pixel TFTs can also be produced through the above-described process. In the present embodiment, the pixel TFTs are also produced together with the peripheral circuit TFTs 53 so as to have an etch stop layer 24, so that etching damage to the channel region of the oxide semiconductor layer can be reduced.

Hereinafter, an active matrix substrate of a variation of the present embodiment is described with reference to FIG. 12.

Figure 12:
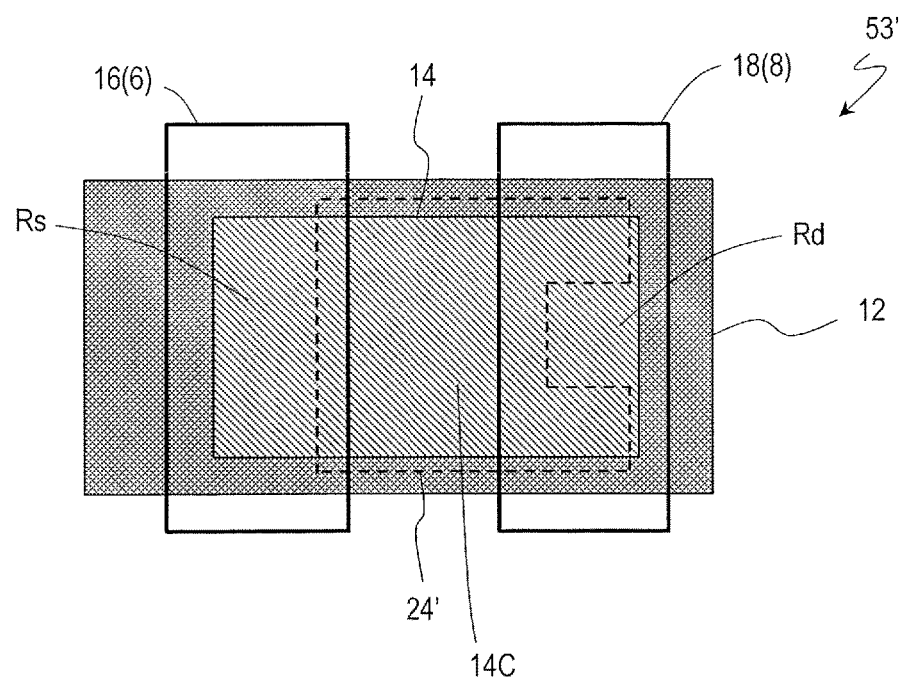
FIG. 12 A plan view showing a configuration of a TFT of a variation of Embodiment 3.

As shown in FIG. 12, in a TFT 53' (peripheral circuit TFT) included in the active matrix substrate of the variation, an etch stop layer 24' which has the shape of an island is provided so as to cover at least a channel portion 14C of the oxide semiconductor layer 14. Note that, however, this island-shaped etch stop layer 24' has an asymmetrical shape in which the source side portion and the drain side portion have different shapes.

More specifically, in the TFT 53' of the variation, the island-shaped etch stop layer 24' is arranged so as to cover the channel region 14C of the oxide semiconductor layer 14 but expose end portions of the oxide semiconductor layer 14. The source electrode 16 and the drain electrode 18 are arranged so as to cover corresponding lateral edges of the etch stop layer 24' and form connecting regions Re and Rd at the exposed portions of the oxide semiconductor layer 14.

Here, in order to form asymmetrical connecting regions Rs and Rd, the source side portion and the drain side portion of the etch stop layer 24' have different edge shapes. More specifically, the source side portion has a linear edge extending across the oxide semiconductor layer, while the drain side portion has a rectangular recess at the edge which partially exposes the oxide semiconductor layer. The drain electrode 18 is connected with part of the oxide semiconductor layer 14 exposed at this recess, whereby the resultant drain connecting region has smaller width and area than the connecting region on the source side.

Embodiment 4

Hereinafter, an active matrix substrate of Embodiment 4 is described. A major difference of the active matrix substrate of Embodiment 4 from the active matrix substrate 100 of Embodiment 1 is that, in at least some of TFTs that are constituents of the monolithic gate driver (peripheral circuit TFTs), which are referred to as TFT 54a, 54b, an oxide semiconductor layer 14' used has an asymmetrical planar shape in which the source side portion and the drain side portion are asymmetrical to each other. Note that, in the following description, components which are equivalent to those of the TFT substrate 100 are designated by the same reference numerals, and repetitive descriptions thereof are avoided.

Figure 13:
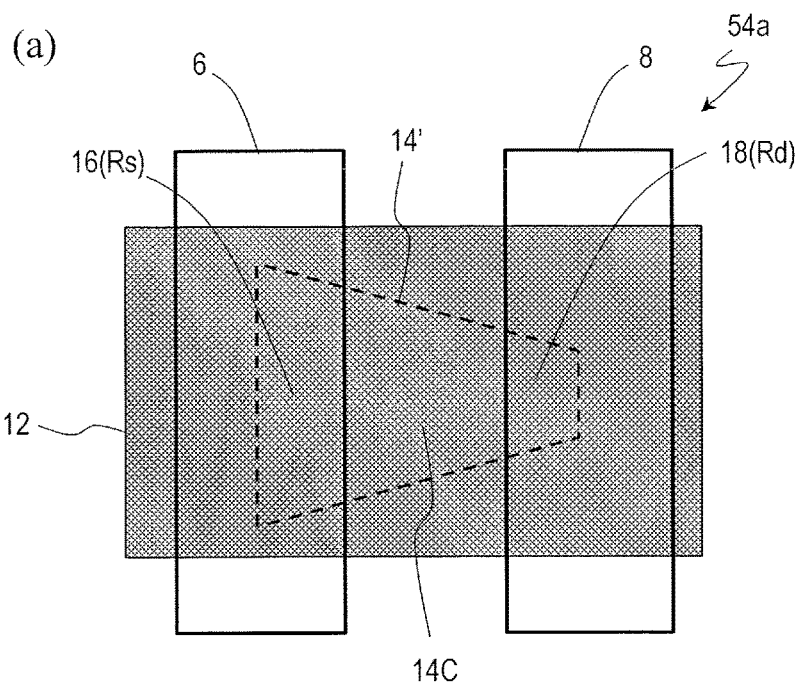
FIG. 13 Plan views showing a configuration of a TFT of Embodiment 4. (a) and (b) show different constructions.
Figure 13:
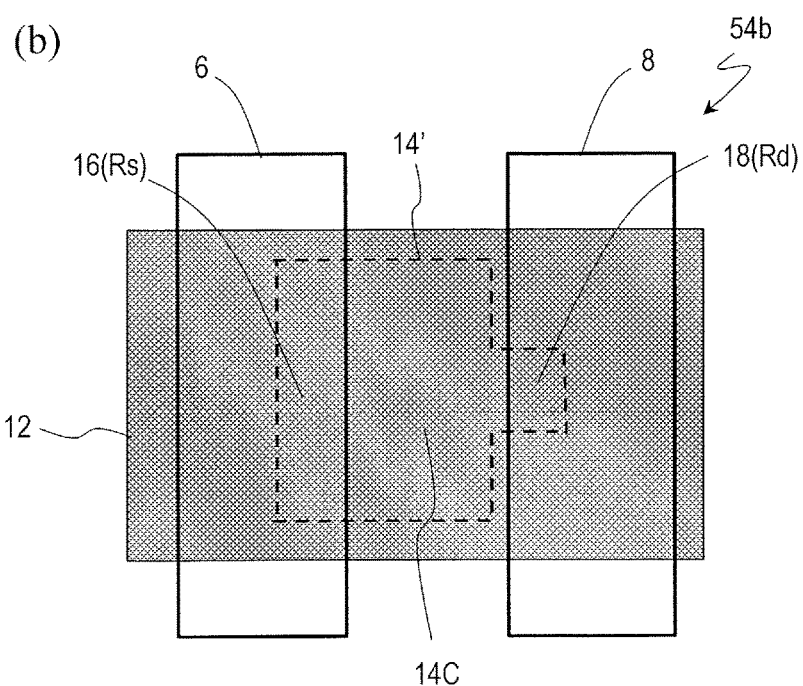

FIG. 13(a) is a plan view showing a configuration of a peripheral circuit TFT 54a in an active matrix substrate of the present embodiment. The TFT 54a may be, for example, a specific one of the plurality of TFTs included in the monolithic gate driver which is particularly required to have an increased breakdown voltage.

The TFT 54a is a bottom gate type TFT. The TFT 54a includes, on an insulative substrate, a gate electrode 12, a gate insulating layer, and an oxide semiconductor layer 14' as does the TFT 5 of Embodiment 1. Here, the oxide semiconductor layer 14' has a trapezoidal planar shape whose upper and lower bases are generally parallel with the channel width direction.

In the TFT 54a, the source line 6 linearly extends in parallel with the channel width direction so as to cover the lower base of the oxide semiconductor layer 14'. Part of the source line 6 which is connected with the oxide semiconductor layer 14' functions as the source electrode 16. In this part, the source connecting region Re is formed.

The drain line 8 linearly extends in parallel with the channel width direction so as to cover the upper base of the oxide semiconductor layer 14'. Part of the drain line 8 which is connected with the oxide semiconductor layer 14' functions as the drain electrode 18. In this part, the drain connecting region Rd is formed.

Thus, when the planar shape of the oxide semiconductor layer 14' is trapezoidal such that the source side portion and the drain side portion are asymmetrical to each other, the width and area of the drain connecting region Rd can be smaller than the width and area of the source connecting region Rs.

FIG. 13(b) is a plan view showing a configuration of a peripheral circuit TFT 54b which is a variation of the present embodiment. In the variation shown in FIG. 13(b), the oxide semiconductor layer 14' has the planar shape of "T" pushed down horizontally ("⊢" shape). The upper side portion of the "T" shape extending in the channel width direction is connected with the source line 6, and the protruding portion of the "T" shape is connected with the drain line 8. Also in such a configuration, the width and area of the drain connecting region Rd can be smaller than the width and area of the source connecting region Rs.

By making the oxide semiconductor layer 14' have an asymmetrical shape such that the source side portion and the drain side portion are asymmetrical to each other as described above, the source line 6 and the drain line 8 can be positioned relatively adjacently. In the present embodiment, parts of the source line 6 and the drain line 8 linearly extending can be used as the source electrode 16 and the drain electrode 18, without connecting the oxide semiconductor layer 14 with the source electrode 16 and the drain electrode 18 via a pair of contact holes of different areas which are provided in the intervening insulating layer (Embodiments 2 and 3). Therefore, the process of providing an insulating layer between the oxide semiconductor layer 14' and the source and drain electrodes 16, 18 can be omitted, and the device size can be set still smaller.

Note that a configuration where the oxide semiconductor layer 14' has an asymmetrical source-drain shape such as in Embodiment 4 can be applied in combination with the TFTs previously described in Embodiments 1-3.

INDUSTRIAL APPLICABILITY

An active matrix substrate of an embodiment of the present invention can be suitably used in a display device, such as a liquid crystal display device, for example. Also, the active matrix substrate can be used, in various devices which are formed using oxide semiconductor TFTs, for suppressing the off leakage current of a TFT which is required to have an increased breakdown voltage.

REFERENCE SIGN LIST 2 gate bus line
4 source bus line
5 TFT (peripheral circuit TFT)
6 source line
8 drain line
10 substrate
11 buffer layer
12 gate electrode
14 oxide semiconductor layer
16 source electrode
18 drain electrode
20 gate insulating layer
22 interlayer insulating layer
24 etch stop layer
100 active matrix substrate
110 gate driver
112 shift resistor
112A bistable circuit
120 source driver
CHS source contact hole
CHD drain contact hole
R1 display region
R2 frame region
Rs source connecting region
Rd drain connecting region

What is claimed is:
1. An active matrix substrate, comprising a display region in which a plurality of pixels are provided and a frame region lying outside the display region, the frame region including a plurality of peripheral circuit TFTs which are supported by a substrate and which are constituents of a driving circuit, wherein
each of the plurality of peripheral circuit TFTs includes a gate electrode, an oxide semiconductor layer arranged so as to at least partially extend over the gate electrode but to be insulated from the gate electrode, and source and drain electrodes connected with the oxide semiconductor layer,
in at least some of the plurality of peripheral circuit TFTs, a source connecting region and a drain connecting region are asymmetrically provided, the source connecting region defining a region in which the oxide semiconductor layer and the source electrode are in direct contact with each other, and the drain connecting region defining a region in which the oxide semiconductor layer and the drain electrode are in direct contact with each other, the gate electrode is a part of a first line extending in a first direction and the source electrode is a part of a second line extending in a second direction intersecting the first direction, when viewed from a normal to the substrate, the oxide semiconductor layer is arranged inside a periphery of the first line, and the second line has an edge extending entirely across the oxide semiconductor layer in the second direction.

2. The active matrix substrate of claim 1, wherein a width of the drain connecting region is smaller than a width of the source connecting region.

3. The active matrix substrate of claim 1, wherein an area of the drain connecting region is smaller than an area of the source connecting region.

4. The active matrix substrate of claim 1, wherein a width of the drain electrode is smaller than a width of the source electrode.

5. The active matrix substrate of claim 1, wherein, in a peripheral circuit TFT in which the source connecting region and the drain connecting region are asymmetrically provided, a voltage applied to the drain electrode in reference to a voltage applied to the source electrode is not less than 20 V during an OFF period.

6. The active matrix substrate of claim 1, wherein the oxide semiconductor layer includes at least one element selected from the group consisting of In, Ga, and Zn.

7. The active matrix substrate of claim 6, wherein the oxide semiconductor layer includes an In—Ga—Zn—O based semiconductor, the In—Ga—Zn—O based semiconductor including a crystalline portion.

8. An organic EL display device comprising the active matrix substrate of claim 1.

9. The active matrix substrate of claim 1, wherein, when viewed from a normal to the substrate, the source connecting region is defined by a region the source electrode overlaps with the oxide semiconductor layer, and the drain connecting region is defined by a region the drain electrode overlaps with the oxide semiconductor layer.

10. The active matrix substrate of claim 1, wherein the drain electrode is a part of a third line extending in the first direction.

11. The active matrix substrate of claim 1, wherein the driving circuit includes shift resistors and the plurality of peripheral circuit TFTs are constituents of the shift resistors.

* * * * *